United States Patent
Kirihara

(10) Patent No.: US 10,658,171 B2
(45) Date of Patent: *May 19, 2020

(54) WAFER PROCESSING APPARATUS

(71) Applicant: DISCO CORPORATION, Tokyo (JP)

(72) Inventor: Naotoshi Kirihara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/392,491

(22) Filed: Apr. 23, 2019

(65) Prior Publication Data
US 2019/0252179 A1 Aug. 15, 2019

Related U.S. Application Data

(62) Division of application No. 15/584,228, filed on May 2, 2017, now Pat. No. 10,388,508.

(30) Foreign Application Priority Data

May 9, 2016 (JP) ................................ 2016-093576

(51) Int. Cl.
H01L 21/02 (2006.01)
B23K 26/384 (2014.01)
B23K 26/06 (2014.01)
B23K 26/08 (2014.01)
B23K 26/38 (2014.01)
(Continued)

(52) U.S. Cl.
CPC ...... *H01L 21/02002* (2013.01); *B23K 26/032* (2013.01); *B23K 26/0617* (2013.01); *B23K 26/0624* (2015.10); *B23K 26/0648* (2013.01); *B23K 26/0853* (2013.01); *B23K 26/38* (2013.01); *B23K 26/384* (2015.10); *B23K 26/40* (2013.01); *B23K 26/402* (2013.01);
(Continued)

(58) Field of Classification Search
CPC . H01L 21/02002; H01L 21/78; H01L 21/268; H01L 21/67092; H01L 21/67115; H01L 21/6836; H01L 21/687; H01L 2221/68327; B23K 26/384; B23K 26/0648; B23K 26/032; B23K 2103/56; B23K 26/0622; B23K 26/356
See application file for complete search history.

(56) References Cited

U.S. PATENT DOCUMENTS 7,547,613 B2 * 6/2009 Fukuyo .................. B23K 26/03
438/463
7,666,760 B2 2/2010 Nakamura
(Continued)

FOREIGN PATENT DOCUMENTS

| JP | 10-305420 | 11/1998 |
| JP | 2002-192370 | 7/2002 |
| JP | 2014-221483 | 11/2014 |

*Primary Examiner* — Bac H Au
(74) *Attorney, Agent, or Firm* — Greer Burns & Crain Ltd.

(57) ABSTRACT

A laser processing apparatus including a condenser having a function of spherical aberration. Since the condenser has a function of spherical aberration, the focal point of a laser beam to be focused by the condenser and applied to a wafer can be continuously changed in position along the thickness of the wafer. Accordingly, a uniform shield tunnel composed of a fine hole and an amorphous region surrounding the fine hole can be formed so as to extend from the front side of the wafer to the back side thereof, by one shot of the laser beam.

13 Claims, 4 Drawing Sheets

(51) Int. Cl.
*B23K 26/402* (2014.01)
*B23K 26/0622* (2014.01)
*H01L 21/78* (2006.01)
*B23K 26/03* (2006.01)
*B23K 26/40* (2014.01)
*H01L 21/30* (2006.01)
*H01L 21/44* (2006.01)
*B23K 101/40* (2006.01)

(52) U.S. Cl.
CPC ............ *H01L 21/30* (2013.01); *H01L 21/44* (2013.01); *H01L 21/78* (2013.01); *B23K 2101/40* (2018.08)

(56) References Cited

U.S. PATENT DOCUMENTS

| | | |
|---|---|---|
| 9,537,046 B2 | 1/2017 | Takeda et al. |
| 9,761,492 B2 | 9/2017 | Shotokuji et al. |
| 10,071,442 B2 | 9/2018 | Morikazu et al. |
| 10,388,508 B2 * | 8/2019 | Kirihara ............. B23K 26/0617 |
| 2009/0302428 A1 | 12/2009 | Sakamoto et al. |
| 2012/0211748 A1 * | 8/2012 | Miccoli ................ B23K 26/032 257/52 |
| 2014/0256150 A1 | 9/2014 | Morikazu et al. |
| 2014/0334511 A1 | 11/2014 | Takeda et al. |

\* cited by examiner

WAFER PROCESSING APPARATUS

CROSS-REFERENCE TO RELATED APPLICATIONS

This application is a divisional of and claims priority to U.S. patent application Ser. No. 15/584,228 filed on May 2, 2017, the entire contents of which is incorporated herein by reference.

BACKGROUND OF THE INVENTION

Field of the Invention

The present invention relates to a laser processing apparatus for performing laser processing to a wafer formed of silicon, sapphire, silicon carbide, or gallium nitride, for example.

Description of the Related Art

A plurality of devices such as integrated circuits (ICs), large scale integrations (LSIs), light emitting diodes (LEDs), surface acoustic wave (SAW) devices, and power devices are formed on the front side of a wafer so as to be separated from each other by a plurality of crossing division lines. The wafer thus having the devices on the front side is laser-processed along each division line by a laser processing apparatus to form a division start point along each division line. The wafer is then divided along each division line where the division start point is formed, thereby obtaining individual device chips. The device chips thus obtained are used in electrical equipment such as mobile phones, personal computers, and illumination equipment (see Japanese Patent Laid-open No. 1998-305420, for example). The laser processing apparatus is composed generally of a chuck table for holding a workpiece, laser beam applying means having condenser for applying a laser beam to the workpiece held on the chuck table, and feeding means for relatively feeding the chuck table and the laser beam applying means, whereby the laser beam is applied along each division line formed on a wafer as the workpiece with high accuracy, thereby forming a division start point along each division line where the wafer is to be divided into individual device chips.

Further, in general, a laser processing apparatus for forming such a division start point is classified into a type such that a laser beam having an absorption wavelength to the workpiece is applied to perform ablation as described in Japanese Patent Laid-open No. 1998-305420 and a type such that a laser beam having a transmission wavelength to the workpiece is applied in the condition where the focal point of the laser beam is set inside the workpiece, thereby forming a modified layer (see Japanese Patent No. 3408805, for example). In either type, however, the laser beam must be applied plural times (in plural passes) along each division line, so as to completely cut the wafer, causing a reduction in productivity.

To cope with this problem, the present applicant has developed and proposed a technique of suitably setting the numerical aperture of a focusing lens for focusing a laser beam having a transmission wavelength to a wafer as a workpiece and applying the laser beam to the wafer, according to the refractive index of the material forming the wafer, thereby forming a plurality of shield tunnels along each division line as a division start point, wherein each shield tunnel extends from the front side of the wafer to the back side thereof, and each shield tunnel is composed of a fine hole and an amorphous region surrounding the fine hole (see Japanese Patent Laid-open No. 2014-221483, for example). In the technique disclosed in the above publication, the focusing lens included in condenser constituting laser beam applying means is provided by an aspherical lens with the shape of its convex or concave surface adjusted or by the combination of plural lenses, whereby the laser beam is focused at one point on an optical axis passing through a work point in the wafer.

SUMMARY OF THE INVENTION

According to the conventional shield tunnel formed by the laser processing apparatus disclosed in Japanese Patent Laid-open No. 2014-221483, a weak division start point can be formed without the need for applying a laser beam plural times (by plural shots) at the same work point. However, it is not easy to form a plurality of desired uniform shield tunnels along each division line according to a change in material or thickness of the wafer. In particular, the strength (weakness) of each shield tunnel to be formed along each division line is largely dependent upon the power of the laser beam to be applied to the wafer. Accordingly, the power of the laser beam must be suitably adjusted so that each shield tunnel to be formed along each division line has a predetermined strength. However, in the case of setting the focal point of the laser beam at one point inside a thinned wafer to form a plurality of shield tunnels along each division line, it is difficult to uniformly form the plural shield tunnels over the entire length of each division line. As a result, in dividing the wafer into individual device chips by applying an external force to the wafer after forming the shield tunnels along each division line, there is a problem such that a relatively large external force (e.g., 40 N) is required.

It is therefore an object of the present invention to provide a laser processing apparatus which can form a plurality of shield tunnels inside a wafer along each division line where the wafer can be divided without the need for a large external force.

In accordance with an aspect of the present invention, there is provided a laser processing apparatus comprising: a chuck table for holding a wafer; laser beam applying means for applying a laser beam to said wafer held on said chuck table; and a feeding mechanism for relatively feeding said chuck table and said laser beam applying means; said laser beam applying means including a laser oscillator for oscillating said laser beam, and a condenser having a focusing lens for focusing said laser beam oscillated by said laser oscillator and applying said laser beam focused to said wafer held on said chuck table; said condenser having a function of spherical aberration such that a focal point to be formed by said laser beam passing through a radially inner portion of said condenser is continuously changed in position toward said chuck table from a focal point to be formed by said laser beam passing through a radially outer portion of said condenser; said laser beam being applied to said wafer in the condition where the focal point of said laser beam is set inside said wafer so as to be continuously changed in position along the thickness of said wafer, thereby forming a shield tunnel inside said wafer, said shield tunnel being composed of a fine hole and an amorphous region surrounding said fine hole.

Preferably, the function of spherical aberration is realized by the focusing lens having spherical aberration. Alternatively, the function of spherical aberration is realized by the focusing lens and a focal point correcting plate located between the focusing lens and the chuck table for correcting the position of the focal point of the laser beam to be focused by the focusing lens. Preferably, the range of change in position from the focal point to be formed by the laser beam passing through the radially outer portion of the condenser to the focal point to be formed by the laser beam passing through the radially inner portion of the condenser is set to 50 to 2000 μm.

According to the laser processing apparatus of the present invention, the condenser has a function of spherical aberration which means a function of continuously changing the position of the focal point of a laser beam to be focused by the condenser and applied to a wafer, along the thickness of the wafer. Accordingly, a uniform shield tunnel composed of a fine hole and an amorphous region surrounding the fine hole can be formed so as to extend from the front side of the wafer to the back side thereof, by one shot of the laser beam. As a result, the energy of the laser beam applied to the wafer can be effectively used to form a good shield tunnel. That is, a uniform shield tunnel can be formed without the need for particularly increasing the power of the laser beam to be applied, so that the strength of the shield tunnel functioning as a division start point can be reduced. Accordingly, the wafer can be divided into individual device chips by applying an external force weaker than that in the prior art.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
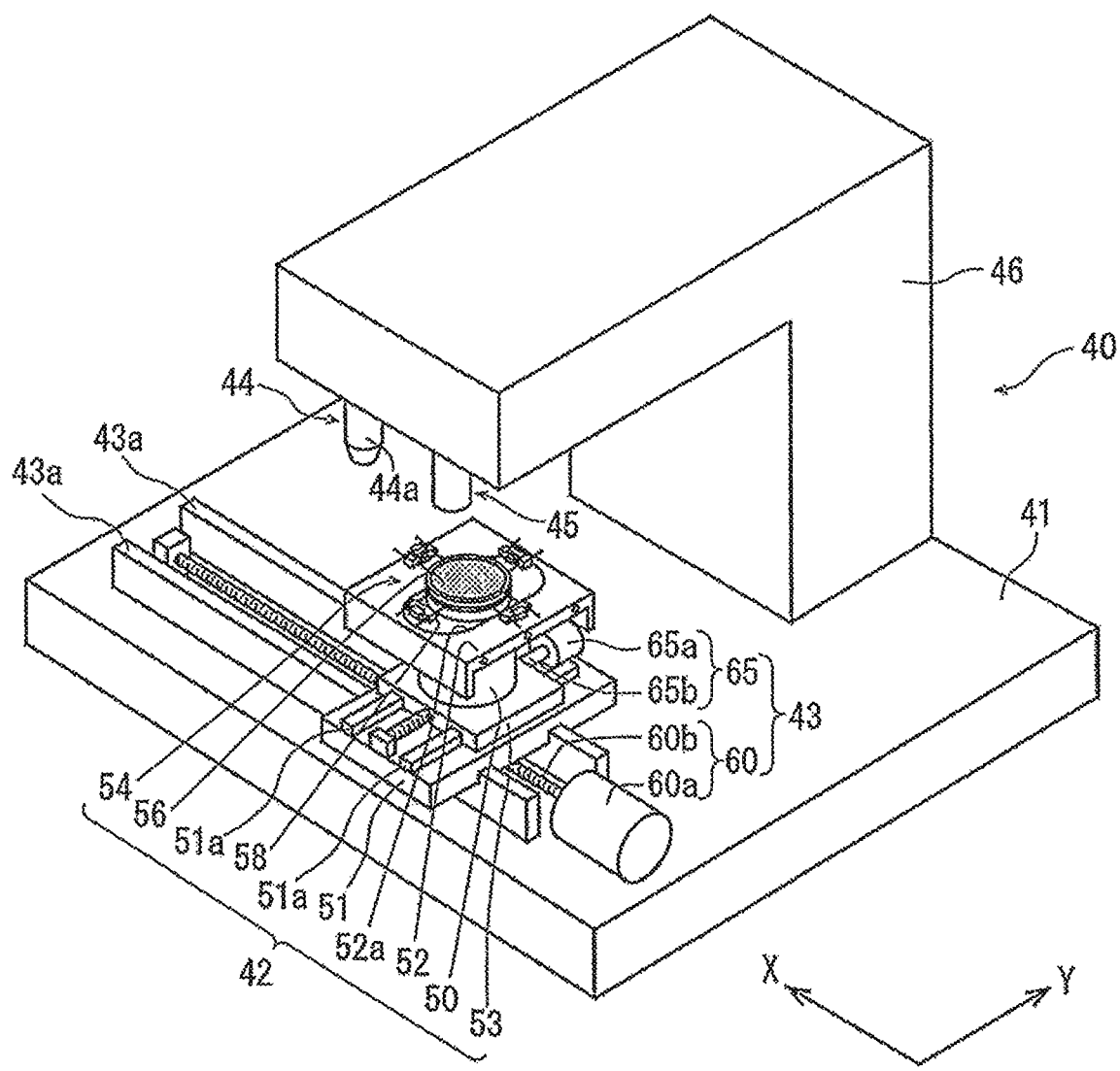
FIG. 1 is a general perspective view of a laser processing apparatus according to a preferred embodiment of the present invention.

A preferred embodiment of the laser processing apparatus according to the present invention will now be described with reference to the attached drawings. FIG. 1 is a general perspective view of a laser processing apparatus 40 according to this preferred embodiment. The laser processing apparatus 40 includes a base 41, a holding mechanism 42 for holding a workpiece such as a wafer, moving means 43 for moving the holding mechanism 42, laser beam applying means 44 for applying a laser beam to the workpiece held by the holding mechanism 42, imaging means 45, and control means (not shown) configured by a computer. The control means functions to control each means mentioned above.

The holding mechanism 42 includes a rectangular X movable plate 51 mounted on the base 41 so as to be movable in an X direction, a rectangular Y movable plate 53 mounted on the X movable plate 51 so as to be movable in a Y direction, a cylindrical support 50 fixed to the upper surface of the Y movable plate 53, and a rectangular cover plate 52 fixed to the upper end of the support 50. The cover plate 52 is formed with an elongated hole 52a extending in the Y direction. A circular chuck table 54 as holding means for holding the workpiece is rotatably mounted on the upper end of the support 50 so as to extend upward through the elongated hole 52a of the cover plate 52. A circular vacuum chuck 56 is provided on the upper surface of the chuck table 54. The vacuum chuck 56 has a substantially horizontal holding surface. The vacuum chuck 56 is formed of a porous material. The vacuum chuck 56 is connected through a suction passage formed in the support 50 to suction means (not shown). A plurality of clamps 58 are provided on the outer circumference of the chuck table 54 so as to be spaced in the circumferential direction thereof. The X direction is defined as the direction shown by an arrow X in FIG. 1, and the Y direction is defined as the direction shown by an arrow Y in FIG. 1, which is perpendicular to the X direction in an XY plane. The XY plane defined by the X direction and the Y direction is a substantially horizontal plane.

The moving means 43 includes X moving means 60, Y moving means 65, and rotating means (not shown). The X moving means 60 includes a ball screw 60b extending in the X direction on the base 41 and a motor 60a connected to one end of the ball screw 60b. The ball screw 60b has a nut portion (not shown), which is fixed to the lower surface of the X movable plate 51. The X moving means 60 is operated in such a manner that the rotational motion of the motor 60a is converted into a linear motion by the ball screw 60b and this linear motion is transmitted to the X movable plate 51, so that the X movable plate 51 is moved in the X direction along a pair of guide rails 43a provided on the base 41. Similarly, the Y moving means 65 includes a ball screw 65b extending in the Y direction on the X movable plate 51 and a motor 65a connected to one end of the ball screw 65b. The ball screw 65b has a nut portion (not shown), which is fixed to the lower surface of the Y movable plate 53. The Y moving means 65 is operated in such a manner that the rotational motion of the motor 65a is converted into a linear motion by the ball screw 65b and this linear motion is transmitted to the Y movable plate 53, so that the Y movable plate 53 is moved in the Y direction along a pair of guide rails 51a provided on the X movable plate 51. The rotating means is built in the support 50 to rotate the chuck table 54, or the vacuum chuck 56 with respect to the support 50.

Figure 2A:
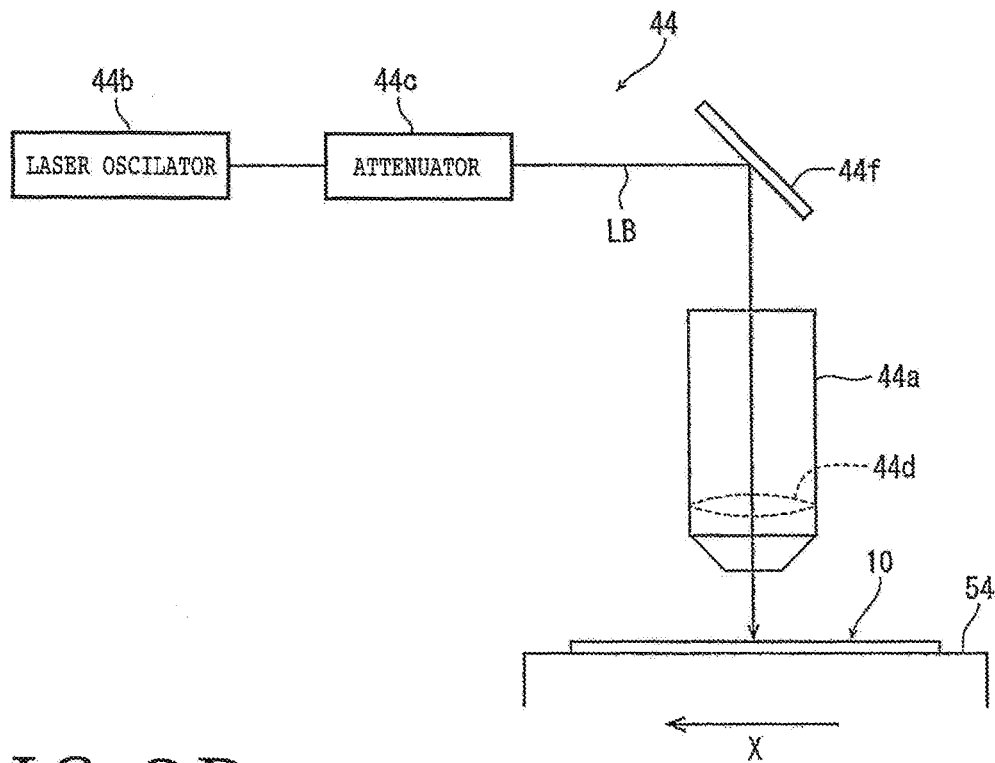
FIG. 2A is a schematic diagram showing the configuration of laser beam applying means included in the laser processing apparatus shown in FIG. 1.

An L-shaped casing 46 is provided on the base 41 at its rear end portion. The L-shaped casing 46 is composed of a vertical portion extending upward from the upper surface of the base 41 and a horizontal portion extending from the upper end of the vertical portion in a substantially horizontal direction. FIG. 2A is a block diagram schematically showing the configuration of the laser beam applying means 44. As shown in FIG. 2A, the laser beam applying means 44 includes a laser oscillator 44b for oscillating a laser beam LB, an attenuator 44c for adjusting the power of the laser beam LB oscillated from the laser oscillator 44b, a reflector plate 44f for reflecting the laser beam LB output from the attenuator 44c, and a condenser 44a having a focusing lens 44d for focusing the laser beam LB reflected by the reflector plate 44f and applying the same to a wafer 10 as the workpiece held on the chuck table 54. The laser beam LB to be oscillated by the laser oscillator 44b has a wavelength (e.g., 1030 nm) for forming a plurality of shield tunnels inside the wafer 10 along each division line, wherein each shield tunnel is composed of a fine hole and an amorphous region surrounding the fine hole.

The control means (not shown) included in the laser processing apparatus 40 is configured by a computer, which includes a central processing unit (CPU) for performing operational processing in accordance with a control program, a read only memory (ROM) preliminarily storing the control program, a random access memory (RAM) for temporarily storing detection values, operational results, etc., an input interface, and an output interface. The input interface functions to input an image signal from the imaging means 45 and detection signals from X position detecting means and Y position detecting means (both not shown) included in the holding mechanism 42, for example. The X position detecting means functions to detect the X position of the chuck table 54 in the X direction, and the Y position detecting means functions to detect the Y position of the chuck table 54 in the Y direction. The output interface functions to output operation signals to the laser oscillator 44b, the X moving means 60, and the Y moving means 65, for example.

As shown in FIG. 1, the imaging means 45 is provided on the lower surface of the front end portion of the casing 46. The imaging means 45 is positioned above the guide rails 43a. Accordingly, by moving the chuck table 54 along the guide rails 43a, the imaging means 45 can image the workpiece held on the chuck table 54. In this preferred embodiment, the imaging means 45 is constituted of an imaging device (charge coupled device (CCD)) (not shown) for imaging the workpiece by using visible light. As a modification, the imaging means 45 may further include an infrared light source for applying infrared light to the workpiece and an infrared imaging device (infrared CCD) for outputting an electrical signal corresponding to the infrared light applied.

Figure 3:
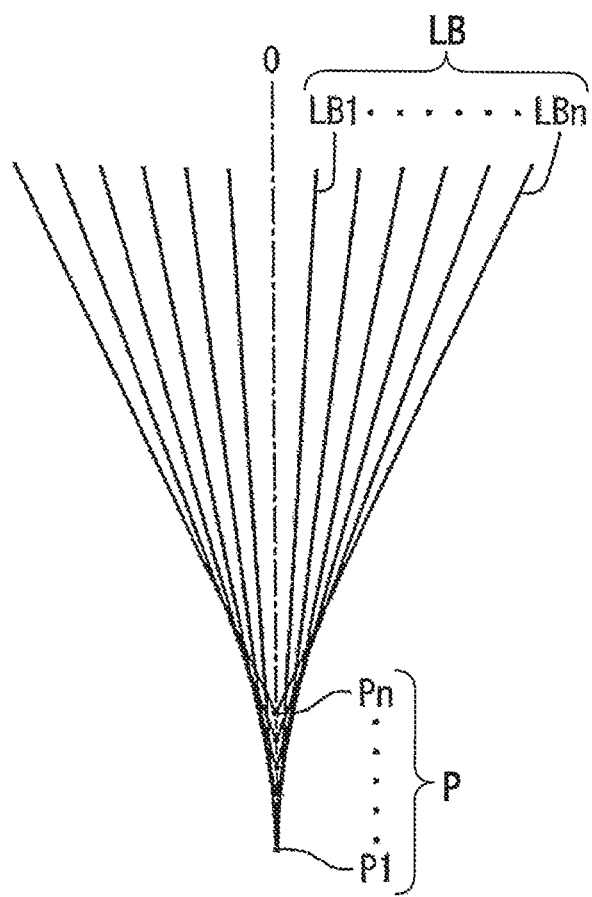
FIG. 3 is a schematic diagram for illustrating a focal position in forming a shield tunnel by using the laser beam applying means shown in FIG. 2A.

The condenser 44a will now be described in more detail with reference to FIGS. 2A and 3. The condenser 44a essentially includes the focusing lens 44d. According to the technical idea of the present invention, the focusing lens 44d has a function of spherical aberration such that a focal point P1 to be formed on the optical axis of the focusing lens 44d by a laser beam LB1 passing through a radially inner portion of the focusing lens 44d is displaced (continuously changed in position) toward the chuck table 54 from a focal point Pn to be formed on the optical axis of the focusing lens 44d by a laser beam LBn passing through a radially outer portion of the focusing lens 44d. This function of spherical aberration may be realized by a spherical lens generally known in the art. However, the present invention is not limited to this configuration, but an aspherical lens or the combination of plural spherical lenses and aspherical lenses may be adopted to realize the function of spherical aberration. That is, any configuration may be adopted, provided that the focal points P1 to Pn can be positioned inside the wafer 10 so as to be displaced in the direction where the laser beam LB enters the wafer 10, i.e., along the thickness of the wafer 10. Further, the range of displacement of the focal points P1 to Pn is preferably set to 50 to 2000 µm. This range of displacement is not necessarily required to be larger than the thickness of the wafer 10 as the workpiece. For example, in the case that the thickness of the wafer 10 is 300 µm, the focal points P1 to Pn are preferably displaced over the range from the front side of the wafer 10 to the back side thereof, i.e., over the wafer thickness of 300 µm, whereby each shield tunnel can be formed more satisfactorily.

Figure 4A:
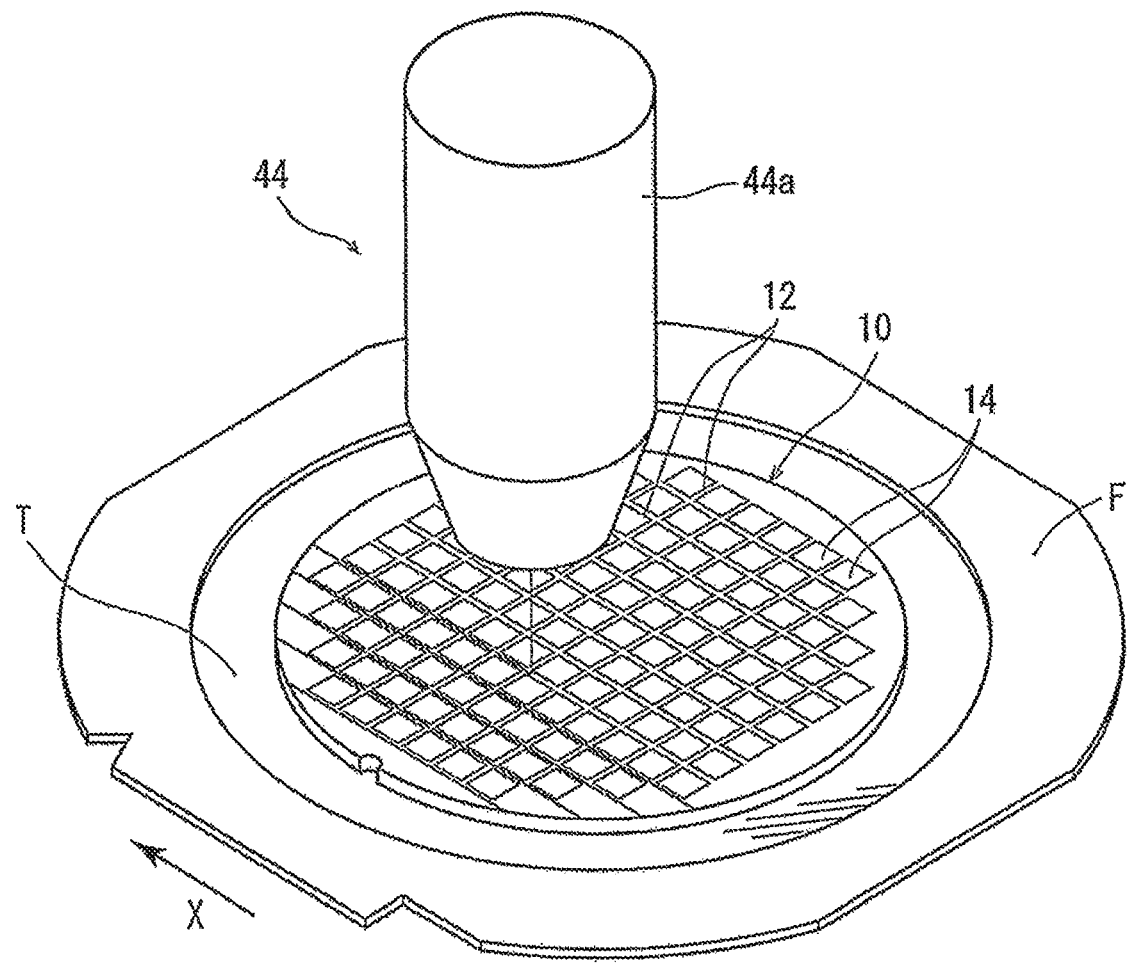
FIG. 4A is a perspective view for illustrating a shield tunnel forming step.

The operation of the laser processing apparatus 40 will now be described with reference to the drawings. Referring to FIG. 4A, there is shown a perspective view of the wafer 10. In this preferred embodiment, the wafer 10 is formed from a lithium tantalate ($LiTaO_3$) substrate. The front side of the wafer 10 is formed with a plurality of crossing division lines 12 to define a plurality of separate regions where a plurality of SAW devices 14 are formed. The back side of the wafer 10 is attached to an adhesive tape T supported at its peripheral portion to an annular frame F. Thus, the wafer 10 is supported through the adhesive tape T to the annular frame F in the condition where the front side of the wafer 10 is exposed.

First, the wafer 10 supported through the adhesive tape T to the annular frame F is placed on the vacuum chuck 56 of the chuck table 54 in the condition where the adhesive tape T is oriented downward. Further, the annular frame F is held by the clamps 58. Thereafter, the suction means (not shown) connected to the vacuum chuck 56 is operated to apply a vacuum to the vacuum chuck 56, thereby holding the wafer 10 through the adhesive tape T on the vacuum chuck 56 under suction.

After holding the wafer 10 on the vacuum chuck 56 under suction, the X moving means 60 and the Y moving means 65 are operated to move the chuck table 54 and thereby position the wafer 10 directly below the imaging means 45. In the condition where the wafer 10 held on the chuck table 54 is positioned directly below the imaging means 45, an alignment step is performed by the imaging means 45 and the control means (not shown) to detect a target area of the wafer 10 to be laser-processed. More specifically, the imaging means 45 and the control means (not shown) perform image processing such as pattern matching for making the alignment between the division lines 12 extending in a first direction on the wafer 10 and the condenser 44a of the laser beam applying means 44 for applying a laser beam along these division lines 12. Similarly, the alignment step is performed also for the other division lines 12 extending in a second direction perpendicular to the first direction.

Figures 4B, 4C:
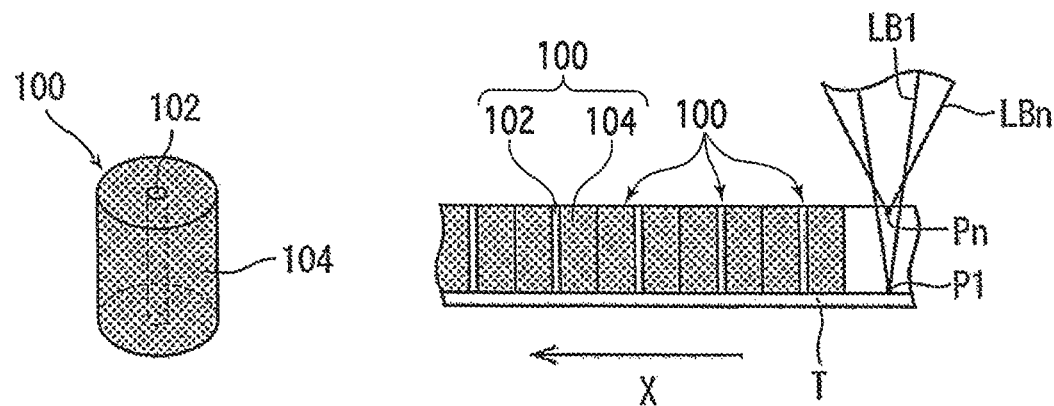
FIG. 4B is a schematic perspective view of a shield tunnel.
FIG. 4C is a sectional view of a wafer in which a plurality of shield tunnels have been formed.

After performing the alignment step for all of the division lines 12, the chuck table 54 is moved to a laser beam applying area where the condenser 44a is located. Further, one end of a predetermined one of the division lines 12 extending in the first direction is positioned directly below the condenser 44a. Thereafter, focal position adjusting means (not shown) included in the laser processing apparatus 40 is operated to move the condenser 44a along its optical axis and thereby set the focal point P of the laser beam LB at a predetermined position inside the lithium tantalate substrate of the wafer 10. More specifically, as shown in FIGS. 3 and 4C, the laser beam LB1 is a laser beam passing through a radially innermost portion of the focusing lens 44d. The focal point P1 to be formed by the laser beam LB1 is set inside the wafer 10 at a position near the chuck table 54, i.e., near the back side of the wafer 10. On the other hand, the laser beam LBn is a laser beam passing through a radially outermost portion of the focusing lens 44d. The focal point Pn to be formed by the laser beam LBn is set inside the wafer 10 at a position near the front side of the wafer 10 where the devices 14 are formed. Accordingly, the focal point P to be formed by the laser beam LB passing through the focusing lens 44d of the condenser 44a is displaced over the range from the back side of the wafer 10 to the front side thereof. In FIGS. 3 and 4C, the laser beam LB is so shown as to be decomposed into the laser beams LB1 to LBn, and the focal point P of the laser beam LB is so shown as to be decomposed into the focal points P1 to Pn for convenience of illustration. However, in actual, the laser beam LB is not seen so as to be decomposed as shown.

After setting the focal point P as described above, the laser beam applying means 44 is operated to oscillate the laser beam LB (pulsed laser beam) from the laser oscillator 44b. The laser beam LB oscillated from the laser oscillator 44b is input into the attenuator 44c, in which the power of the laser beam LB is adjusted to a predetermined value. Thereafter, the laser beam LB is focused by the condenser 44a and applied to one end of the predetermined division line 12 on the wafer 10. When the application of the laser beam LB is started, the X moving means 60 is operated to move the chuck table 54 in the direction shown by an arrow X in FIG. 4A, thereby scanning the laser beam LB along the predetermined division line 12. Accordingly, as shown in FIGS. 4B and 4C, a plurality of shield tunnels 100 are continuously formed along the predetermined division line 12, wherein each shield tunnel 100 is composed of a fine hole 102 extending vertically (axially over the entire length of each shield tunnel 100) and a cylindrical amorphous region 104 for shielding the fine hole 102 so as to surround the same. This laser processing is similarly performed along all of the other division lines 12 formed on the front side of the wafer 10 by operating the laser beam applying means 44, the chuck table 54, the X moving means 60, and the Y moving means 65, thereby forming a plurality of similar shield tunnels 100 along each division line 12 (shield tunnel forming step). After performing the shield tunnel forming step, the wafer 10 is transferred to any apparatus for performing a dividing step of dividing the wafer 10 into individual device chips corresponding to the respective devices 14 by applying an external force to the wafer 10. This dividing step is not essential in the present invention. As the apparatus for performing the dividing step, any dividing means known in the art may be used (see Japanese Patent Laid-open No. 2014-221483, FIG. 8 and its related description, for example). Accordingly, the detailed description of the dividing step and the dividing means will be omitted herein.

For example, the shield tunnel forming step is performed under the following processing conditions.

Wavelength: 1030 nm
Average power: 3 W
Repetition frequency: 50 kHz
Pulse width: 10 ps
Spot diameter: 10 μm
Numerical aperture of the focusing lens/Refractive index of the wafer: 0.05 to 0.20
Work feed speed in the X direction: 500 mm/second
Size of each shield tunnel: fine hole 1 μm in diameter, amorphous region 10 μm in diameter As described above, the condenser 44a in the laser processing apparatus 40 has a function of spherical aberration such that the focal point P1 to be formed by the laser beam LB1 passing through the radially inner portion of the condenser 44a is displaced toward the chuck table 54 from the focal point Pn to be formed by the laser beam LBn passing through the radially outer portion of the condenser 44a, wherein the laser beam LB composed of the laser beams LB1 to LBn is applied to the wafer 10 in the condition where the focal point P of the laser beam LB is set inside the wafer 10, thereby forming the shield tunnel 100 composed of the fine hole 102 and the amorphous region 104 surrounding the fine hole 102. Accordingly, the energy of the laser beam LB can be effectively used for the formation of the shield tunnel 100, so that a plurality of good shield tunnels 100 can be continuously formed along each division line 12 over the entire length thereof. Further, each shield tunnel 100 can be formed over the entire thickness of the wafer 10, so that each division line 12 can be sufficiently reduced in strength over the entire length. Accordingly, in the dividing step, the wafer 10 can be easily divided into the individual device chips by applying a relatively small external force.

Figure 2B:
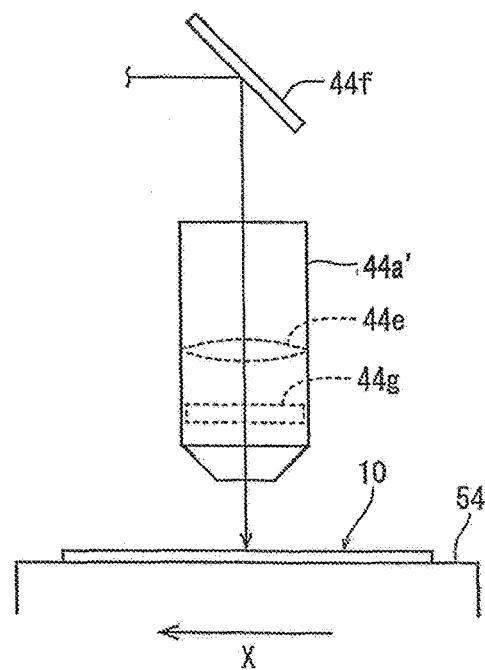
FIG. 2B is a view similar to FIG. 2A, showing a modification.

In this preferred embodiment, the focusing lens 44d of the condenser 44a has a function of spherical aberration such that the focal point P1 to be formed by the laser beam LB1 passing through the radially inner portion of the focusing lens 44d is displaced toward the chuck table 54 from the focal point Pn to be formed by the laser beam LBn passing through the radially outer portion of the focusing lens 44d. This configuration is merely illustrative, and the present invention is not limited to this configuration. FIG. 2B shows a modification of the above configuration. As shown in FIG. 2B, condenser 44a' having a focusing lens 44e and a focal point correcting plate 44g may be used in place of the condenser 44a. The focal point correcting plate 44g is located between the focusing lens 44e and the chuck table 54. The focusing lens 44e has a lens surface for forming a focal point at one position inside the wafer 10. The focal point correcting plate 44g is located between the focusing lens 44e and the wafer 10 held on the chuck table 54, and it has a function of correcting the focal point of the laser beam having passed through the focusing lens 44e in such a manner that the focal point to be formed by the laser beam passing through a radially inner portion of the focal point correcting plate 44g is displaced toward the chuck table 54 from the focal point to be formed by the laser beam passing through a radially outer portion of the focal point correcting plate 44g.

The above-mentioned function of the focal point correcting plate 44g may be realized by using glass as the material of the focal point correcting plate 44g and forming a spherical convex surface as the beam entrance surface of the focal point correcting plate 44g where the laser beam enters. By locating the focal point correcting plate 44g at the above-mentioned position, the traveling direction of the laser beam LB having passed through the focusing lens 44e is corrected by passing the laser beam through the focal point correcting plate 44g, that is, the traveling direction of the laser beam is changed between at the radially inner portion of the focal point correcting plate 44g and the radially outer portion thereof. Accordingly, the focal point to be formed by the laser beam passing through the radially inner portion of the condenser 44a' is displaced toward the chuck table 54 from the focal point to be formed by the laser beam passing through the radially outer portion of the condenser 44a', wherein the laser beam is applied to the wafer 10 in the condition where the focal point of the laser beam is set inside the wafer 10 to thereby form a shield tunnel. As a result, an effect similar to that in the above preferred embodiment can be achieved. That is, the energy of the laser beam can be effectively used for the formation of the shield tunnel, so that a plurality of good shield tunnels can be continuously formed along each division line over the entire length thereof.

The term of "the function of spherical aberration" does not mean the function obtained in only the case that a completely spherical convex lens is used to provide aberration. Essentially, this term includes the function of providing the configuration that the focal point to be formed by the laser beam passing through the radially inner portion of the condenser is displaced toward the chuck table from the focal point to be formed by the laser beam passing through the radially outer portion of the condenser. Further, while the laser beam is applied to the front side of the wafer where the SAW devices are formed in the above preferred embodiment, the present invention is not limited to this configuration. The laser beam may be applied to the back side of the wafer in the condition where the front side of the wafer is oriented downward.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a chuck table for holding a wafer;
laser beam applying means for applying a laser beam to said wafer held on said chuck table; and
a feeding mechanism for relatively feeding said chuck table and said laser beam applying means;
said laser beam applying means including
a laser oscillator for oscillating said laser beam, and
a condenser having a focusing lens for focusing said laser beam oscillated by said laser oscillator and applying said laser beam focused to said wafer held on said chuck table;
said condenser having a lens configured to realize spherical aberration such that a focal point to be formed by said laser beam passing through a radially inner portion of said condenser is continuously changed in position toward said chuck table from a focal point to be formed by said laser beam passing through a radially outer portion of said condenser;
said laser beam being applied to said wafer in the condition where the focal point of said laser beam is set inside said wafer so as to be continuously changed in position along the thickness of said wafer to account for changes in the thickness of said wafer, thereby forming a shield tunnel inside said wafer, said shield tunnel being composed of a fine hole and an amorphous region surrounding said fine hole.

2. The laser processing apparatus according to claim 1, wherein the range of change in position from the focal point to be formed by said laser beam passing through the radially outer portion of said condenser to the focal point to be formed by said laser beam passing through the radially inner portion of said condenser is set to 50 to 2000 µm.

3. The laser processing apparatus according to claim 1, wherein said lens is an aspherical lens.

4. The laser processing apparatus according to claim 1, wherein said condenser includes a plurality of spherical lenses and a plurality of aspherical lenses.

5. A method of applying a laser beam to a wafer having a plurality of division lines for dividing the wafer into a plurality of device chips, the method comprising:
holding the wafer by a chuck table;
aligning at least one division line of the plurality of division lines of the wafer with a laser beam applying means;
setting a focal point of a laser beam emitted by said laser beam applying means using a focusing lens configured to realize spherical aberration, wherein the focal point to be formed by said laser beam passing through a radially inner portion of said focusing lens continuously changes in position toward said chuck table from said focal point to be formed by said laser beam passing through a radially outer portion of said focusing lens; and
applying said laser beam to said at least one division line using said laser beam applying means, wherein said focal point of said laser beam is set inside said wafer so as to be continuously changed in position along a thickness of said wafer to account for changes in said thickness of said wafer, thereby forming a plurality of shield tunnels inside said wafer along said at least one division line, each of said shield tunnels including a fine hole and an amorphous region surrounding said fine hole.

6. The method according to claim 5, wherein the range of change in position of said focal point of said laser beam toward said wafer from said focal point is set to 50 to 2000 µm.

7. The method according to claim 5, further comprising a condenser including said focusing lens, wherein said condenser is configured to produce said spherical aberration.

8. The method according to claim 5, wherein the range of change in position from the focal point to be formed by said laser beam passing through a radially outer portion of said condenser to the focal point to be formed by said laser beam passing through a radially inner portion of said condenser is set to 50 to 2000 µm.

9. The method according to claim 5, further comprising a focal point correcting plate located between said focusing lens and said wafer for correcting the position of the focal point of said laser beam to be focused by said focusing lens.

10. The method according to claim 9, wherein said focal point correcting plate is made of glass.

11. The method according to claim 9, wherein said focal point correcting plate includes a spherical convex surface.

12. The method according to claim 5, wherein said focusing lens is an aspherical lens.

13. The method according to claim 5, wherein setting a focal point of a laser beam emitted by said laser beam applying means includes using a plurality of spherical lenses and a plurality of aspherical lenses configured to realize spherical aberration.

* * * * *